(12) United States Patent
Koops et al.

(10) Patent No.: US 7,452,477 B2
(45) Date of Patent: Nov. 18, 2008

(54) PROCEDURE FOR ETCHING OF MATERIALS AT THE SURFACE WITH FOCUSSED ELECTRON BEAM INDUCED CHEMICAL REACTION AT SAID SURFACE

(75) Inventors: Hans Wilfried Peter Koops, Ober-Ramstadt (DE); Klaus Edinger, Heppenheim (DE)

(73) Assignee: NaWoTec GmbH, Rossdorf (DE)

( * ) Notice: Subject to any disclaimer, the term of this patent is extended or adjusted under 35 U.S.C. 154(b) by 626 days.

(21) Appl. No.: 10/628,174

(22) Filed: Jul. 28, 2003

(65) Prior Publication Data

US 2005/0072753 A1     Apr. 7, 2005

(30) Foreign Application Priority Data

Oct. 16, 2002 (EP) .................. 02023217

(51) Int. Cl.
C23F 1/00 (2006.01)
(52) U.S. Cl. .............. 216/62; 216/63; 216/66
(58) Field of Classification Search .......... None
See application file for complete search history.

(56) References Cited

U.S. PATENT DOCUMENTS

| | | | | |
|---|---|---|---|---|
| 3,968,476 A * | 7/1976 | McMahon | ........ | 382/127 |
| 4,650,778 A * | 3/1987 | Klabunde et al. | ........ | 502/8 |
| 5,055,696 A * | 10/1991 | Haraichi et al. | ........ | 250/492.2 |
| 5,113,072 A * | 5/1992 | Yamaguchi et al. | ........ | 250/309 |
| 5,151,135 A * | 9/1992 | Magee et al. | ........ | 134/1 |
| 5,229,320 A * | 7/1993 | Ugajin | ........ | 438/694 |
| 5,665,277 A * | 9/1997 | Johnson et al. | ........ | 264/6 |
| 5,665,658 A * | 9/1997 | Passlack | ........ | 438/763 |
| 5,683,547 A * | 11/1997 | Azuma et al. | ........ | 438/695 |
| 6,038,015 A * | 3/2000 | Kawata | ........ | 355/67 |
| 6,067,062 A * | 5/2000 | Takasu et al. | ........ | 345/87 |
| 6,077,621 A * | 6/2000 | Allen et al. | ........ | 429/33 |
| 6,261,938 B1 * | 7/2001 | Beauvais et al. | ........ | 438/607 |
| 6,387,530 B1 * | 5/2002 | Liu et al. | ........ | 428/559 |

(Continued)

FOREIGN PATENT DOCUMENTS

DE          100 42 098 A     3/2002

(Continued)

OTHER PUBLICATIONS

ISR/EP 02023217, Apr. 29, 2003, NaWoTec GmbH.

(Continued)

Primary Examiner—Allan Olsen
(74) Attorney, Agent, or Firm—Woodling, Krost and Rust

(57) ABSTRACT

The invention relates to a procedure for etching of materials at the surface by focussed electron beam induced chemical reaction at the surface, with the following steps: a) in a vacuum atmosphere the material which is to be etched is irradiated with at least one beam of molecules and at least one first beam of electrons, whereby the irradiated material and the molecules of the beam of molecules are excited in a way that a chemical reaction takes place and forms a reaction product, which is not gaseous/not volatile—reaction step. The invention is characterized in that b) the reaction product is evaporated from said surface by an second beam of electrons, which heats the material locally to a temperature above the vaporisation temperature of the reaction product —removal step—.

Figure 1:
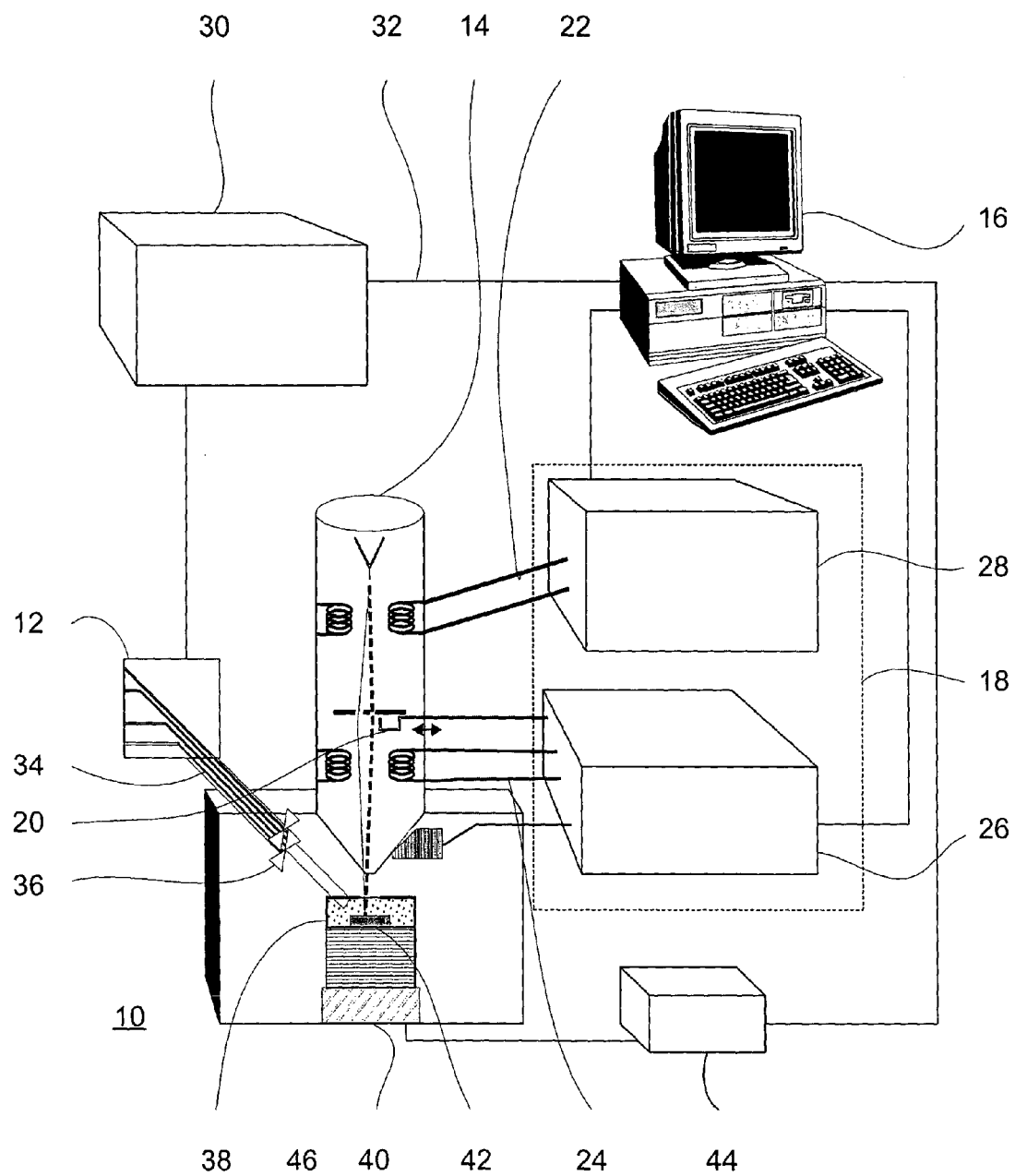

24 Claims, 2 Drawing Sheets step I     step II

U.S. PATENT DOCUMENTS

| | | | |
|---|---|---|---|
| 6,673,127 B1 * | 1/2004 | Allen et al. | 29/623.1 |
| 6,677,586 B1 * | 1/2004 | Nasser-Ghodsi et al. | 250/310 |
| 6,751,516 B1 * | 6/2004 | Richardson | 700/119 |
| 6,787,783 B2 * | 9/2004 | Marchman et al. | 250/492.2 |
| 6,843,927 B2 * | 1/2005 | Naser-Ghodsi | 216/84 |
| 6,943,350 B2 * | 9/2005 | Nasser-Ghodsi et al. | 250/310 |
| 2001/0052577 A1 * | 12/2001 | Aki et al. | 250/492.2 |
| 2003/0000921 A1 * | 1/2003 | Liang et al. | 216/59 |
| 2003/0066749 A1 * | 4/2003 | Golovchenko et al. | 204/192.32 |
| 2004/0033425 A1 | 2/2004 | Koops | |
| 2006/0192141 A1 | 8/2006 | Koops | |

FOREIGN PATENT DOCUMENTS

| | | |
|---|---|---|
| WO | WO 02 19375 A | 3/2002 |

OTHER PUBLICATIONS

Koops , High-Resolution Electron-Beam Induced Deposition, Journal of Vacuum Science: Part B, 1988, pp. 477-481, V 6, No. 1, American Institute of Physics, New York, US.

Haight et al., MARS: Femtosecond laser mask advanced repair system in manufacturing, J. Vac. Sci. Technol. B17(6), Nov./Dec. 1999, 3137-3143, 17(6), American Vacuum Society.

Ehrlich et al., A Review of Laser-Microchemical Processing, J. Vac. Sci. Technol. B, Oct.Dec. 1983, 969-984, vol. 1, No. 4, American Vacuum Society.

* cited by examiner

PROCEDURE FOR ETCHING OF MATERIALS AT THE SURFACE WITH FOCUSSED ELECTRON BEAM INDUCED CHEMICAL REACTION AT SAID SURFACE

The invention relates to a procedure for etching of materials at the surface with focussed electron beam induced chemical reactions at said surface according to the features of the introductory part of claim 1 and a device for carrying out the procedure according to claim 15.

In general the invention relates to focussed electron beam induced chemical reactions and their application to material processing. In particular it relates to the removal of material with high spatial resolution using electron beam induced etching. It also relates to the repair of photo masks, stencil masks, EUV- and other Next Generation Lithography masters and masks and the modification of integrated circuits and other devices on a nanometre scale.

A number of direct writing technologies, most of them based on focussed particle or photon beams, have been developed so that they allow the modification of materials on a nanometre scale. Examples where those technologies are applied in the semiconductor industry include the repair of photo masks and the modification of integrated circuits. In most of these applications it is required that the technology can remove as well as add material with sub-micrometer precision. For material addition it might be necessary to deposit several materials having specific chemical and physical properties. For material removal it might be required to remove one material selected from a combination of materials without creating damage to the remaining material. Other requirements might include the obtainable positioning accuracy and the minimum feature size, e.g. resolution, of the process. Some of these requirements will be illustrated in the following for photolithographic mask repair, which is one preferred application of the present invention. For this purpose, photon beam ablation, photon beam induced chemical etching, ion beam sputtering and ion beam assisted chemical etching are or could potentially be used to etch materials used for photo masks in the semiconductor fabrication process. Photolithographic masks usually consist of a light transparent substrate, e.g. glass, quartz, which carries a structured chromium metal layer of 100 nm thickness. On the masks certain areas are patterned using a light absorbing material—absorber—, such as chromium, to block light transmission in these areas. These masks are used in the semiconductor industry to project a pattern located on the mask onto a wafer, which is covered with a light sensitive substance, e.g. a photoresist. These masks can have at least two kinds of defects, which need to be repaired.

1) Absorber material is missing, where there should be an absorber—clear defect—and
2) absorber material in areas where there should be no absorber—opaque defect.

Currently, common mask repair tools are based on a laser beam or a focussed ion beam—FIB. Chemical and/or physical processes that are or could be employed by these tools are photon beam ablation, photon beam induced chemical etching, ion beam sputtering and ion beam assisted chemical reactions, deposition and etching.

It is state of the art to remove absorber material such as chrome by a focussed laser beam. Usually, high energy short pulse laser beams are used. Interaction between the laser beam and the material can be for example photothermal or photochemical. Mask repair laser ablation is used, where the material is evaporated by locally heating it with the laser beam. Laser induced chemical reactions could potentially also be used for mask repair, where the laser beam provides the energy to cause a reaction between the material and a suitable gas such as chlorine, resulting in volatile products that desorb. In this context it is referred to the article "MARS: Femtosecond laser mask advanced repair system in manufacturing" of R. Haight, D. Hayden, P. Longo, T. Neary and A. Wagner in Japanese Vacuum Science Technology, 17(6), November/December 1999, pages 3137 to 3143 and to the Article "A review of laser-microchemical processing" of D. J. Ehrlich and J. Y. Tsao, J. Vac. Sci. Technol. B 1 (4), October-December 1983.

However, all photon beam based processing suffers from a limited resolution due to the Abbé diffraction resolution criterion, which tells that the obtainable resolution is ca. 0.5 times the wavelength of the light in use.

Ion beam sputtering is an effective process with potentially 10 nm resolution, but generates damage in the substrate which is not tolerable for several applications. Ion beam assisted chemical etching is also an effective process with somewhat lower resolution, approximately 100 nm, but also generates damage in the substrate which is not tolerable for several applications. Both processes are applied for etching of opaque defects in photo mask repair.

With the increasing resolution requirements of photo masks for the chip production in the next generations, and with the additional technical modification of the mask pattern to obtain the required resolution such as optical proximity effect structures or phase shift masks, and EUV-multilayer masks, the semiconductor industry is today in the situation that the approved methods of laser ablation and deposition, as well as the ion beam sputtering, and chemically assisted ion beam etching and deposition is no longer tolerable because of lack of resolution and lack of transmission of the substrate after the repair. Therefore, a nondestructive soft and clean chemical etching method needs to be applied for opaque defects in photomasks and "next generation masks" such as EUV masks, which does not implant metal ions into the substrate and does not mix the underlying material causing structural damage introduced by the ion impact.

Currently, focussed electron beams are only used to repair clear defects by locally adding absorber material. This is done by exposing a selected local area with an electron beam, while simultaneously delivering a flow of precursor gas to the area. The electron beam then decomposes the precursor gas, e.g. hydrocarbons, inorganic, or organometallic molecules, leaving behind a deposit in the area that was scanned by the electron beam. Removal of material is more difficult because electrons do not deliver enough momentum to eject, e.g. sputter, substrate atoms, like a focussed ion beam can. At present, electron beam etching has only been demonstrated for a few material systems, where activated by the focussed electron beam, a chemical reaction is induced, which results in volatile products and, thus, a removal of material.

Although there is only very little research on electron beam induced etching reactions, the reaction will certainly be a complex sequence of single elementary reactions, which will involve several steps such as adsorption of precursor gas molecules—physisorption and/or chemisorption—, diffusion of precursor molecules or their fragments into the substrate, one or more reactions between these precursor molecules and the substrate atoms and finally the desorption of the reaction product. In order to confine the etching process to an area that has been exposed with a focussed electron beam and thus provides the high spatial resolution of the process, it is required that the etching process does not occur spontaneously and at least one step in the reaction sequence has to be induced by electron beam exposure. An example for electron beam induced etching is the removal of silicon dioxide—$SiO_2$ with $XeF_2$ were etching only takes places in areas that have been simultaneously exposed to a beam of electrons and $XeF_2$ molecules. See for example: Ted Liang, A. Stivers, G. Liu, G. Dao, V. Liberman, M. Rothschild, S. T. Palmacci and L. Scipioni, "Damage-free Mask Repair Using Electron Beam Induced Chemical Reactions", 2nd Int'l. Symp.on 157 nm Lithography, Dana Point, Calif. (May 2001).

The very high resolution and precision of material etching in the photo mask repair and circuit editing procedures of the semiconductor industry in its novel circuits and masks with structures below the wavelength of the ultra violet light requires a novel technology to be employed for the repair of such structures.

Therefore, it is an object of the present invention to improve the procedure for etching of materials at the surface with focussed electron beam induced chemical reactions at said surface so as to overcome the cited drawbacks and to propose a procedure for locally removing material with higher spatial resolution.

It is especially an object of the invention to etch multilayer structures without mixing of the sometimes only a few 10 nm thick layers of the metals and insulators.

This object is achieved by the characterizing features as defined in claim 1 in conjunction with the features in its introductory part.

The understanding underlying the invention is that a combination of a first kind of focussed beam of electrons and a beam of molecules provides the high spatial resolution and the required activation energy for a chemical reaction, forming a reaction product which can be removed by a second kind of beam of electrons. Hereby said reaction only takes place in areas that have been exposed and chemically or physically modified by said first beam of electrons.

According to the invention the procedure for etching of materials at the surface by focussed electron beam induced chemical reaction at the surface comprises the following steps:

a) in a vacuum atmosphere the material which is to be etched is irradiated with at least one beam of molecules and at least one first beam of electrons, whereby the irradiated material and the molecules of the beam of molecules are excited in a way that a chemical reaction takes place and forms a reaction product, which is not gaseous/not volatile—reaction step—,
 b) the reaction product is evaporated from said surface by an second beam of electrons, which heats the material locally to a temperature above the vaporisation temperature of the reaction product—removal step—.

Especially, an electron beam generating electron beam column is provided which generates said first as well as said second beam of electrons.

According to one embodiment of the invention said second beam of electrons is generated in a different setting over said first beam of electrons and especially in a pulsed and/or focussed way.

According to a further embodiment of the invention initially the surface of the material to be etched is cleaned—cleaning step.

Advantageously the cleaning step is realised by a further chemical reaction forming a further reaction product to remove contamination, oxides or other the material covering surface layers.

On the one hand the further chemical reaction could be induced by an additional beam of molecules. Then the material covering the surface layer is especially formed by carbon contamination and said additional beam of molecules comprising water, hydrogenperoxyde, chlorine or other halogen compounds which release excited halogen atoms to react with the carbon from surface layer.

On the other hand the further chemical reaction could be induced by an additional beam of molecules and a third beam of electrons. Then the material covering the surface layer is especially formed by silicon oxides on silicon and said additional beam of molecules comprising chlorine or other halogen compounds which releases excited halogen atoms under irradiation with said third beam of electrons and react with the silicon oxides and coating layer under electron beam excitation to said further reaction product.

In the case the further reaction product is not gaseous/volatile then the further reaction product could be evaporated by heating the surface of the area to be cleaned with a fourth focussed beam of electrons having sufficient power density or energy density to heat the surface to a temperature above the vaporisation temperature of the further reaction product.

Especially said third and/or fourth beam of electrons is/are generated in a different setting over said first and/or second beam of electrons. Said electron beam generating electron beam column could generate the third and fourth beam of electrons.

According to one embodiment of the invention said beam of molecules consisting of selected chemical compounds in a stoichiometric composition issued from a gas feeding system to the material surface during said reaction step.

Furthermore, a device for carrying out the above mentioned procedure according to the invention having especially an electron beam generating electron beam column with a control device to switch between predetermined positions delivering different power for said electron beam generating electron beam column and insofar different intensities of said beams of electrons.

Advantageously said control device further controls apertures for the different beam of electrons and/or said control device further controls deflection means for the different beam of electrons.

In summary, the present invention describes a procedure to remove material with high spatial resolution using a focussed beam of electrons to define the area to be removed. The material is removed by a reaction between the substrate material and a suitable precursor gas—beam of molecules—such as halogens. Especially the invention describes to etch materials having not volatile etch products, forming the reaction product of the reaction step. The precursor gas leaded to the surface to be etched in the kind of said beam of molecules using a multi-jet gas supply. Herewith chemicals are dispensed to the surface, which is to be etched.

A first beam of electrons as an energy source with high local definition and in a different setting over a second beam of electrons as a source to heat-treat the etch products and the substrate using a well timed application of the beams. To render high etch rates a special material supply and energy supply timing procedure is disclosed.

With a first thermal treatment of the substrate by a third beam of electrons in a different setting the surface is cleaned by induced desorption. Then a low dose of said first beam of electrons is used to generate the chemisorption sites for the reactant gas molecules on the substrate, in the area where the substrate is to be etched. After this one or more species the reactive gas molecules or its precursors are issued from the multi jet gas supply system in the appropriate stoichiometric composition to obtain a chemical reaction in the monolayer of adsorbents with the sample surface. If required in a next first beam of electrons exposure a reaction of the adsorbed layers, the specific disproportioning reaction of precursor molecules, is triggered to generate the reactive radicals in the monolayer and to generate the conditions for the etching reaction of the sample material.

The setting of the first beam is typically several pA in a well focused and stigmated setting with µsec to msec duration. This beam cannot heat the surface of the sample due to the high thermal conductance of the solid and due to the only a few $nm^2$ large irradiated area.

Generally a solid or liquid compound is obtained by the etching reaction. This chemical reaction product is in turn evaporated by the subsequent thermal treatment of the area with a short high power pulse of the second beam of electrons in a different electron optical setting of the electron beam system, which heats the substrate area up to a temperature above the sublimation or evaporation temperature of the generated compound, namely the reaction product.

For this work a broad beam with high current in a possibly defocused setting is used with a current of some 1 to 20 nA and a pulse duration of µsec to msec. Such irradiation heats the surface in the center of the irradiated area due to the higher incoming energy, than it can be conducted away. This heating happens only in a very short time, but can reach very high temperatures.

In turn all other adsorbates are driven off from the surface and a new cycle as described above follows to supply the reactants and to etch the substrate material in this well timed procedure.

Repetition of the described cycles renders etch rates of micrometers per minute.

The procedure according to the invention is especially used for etch procedures for chrome, copper, silicon and other metals and metal compounds.

Figure 2:
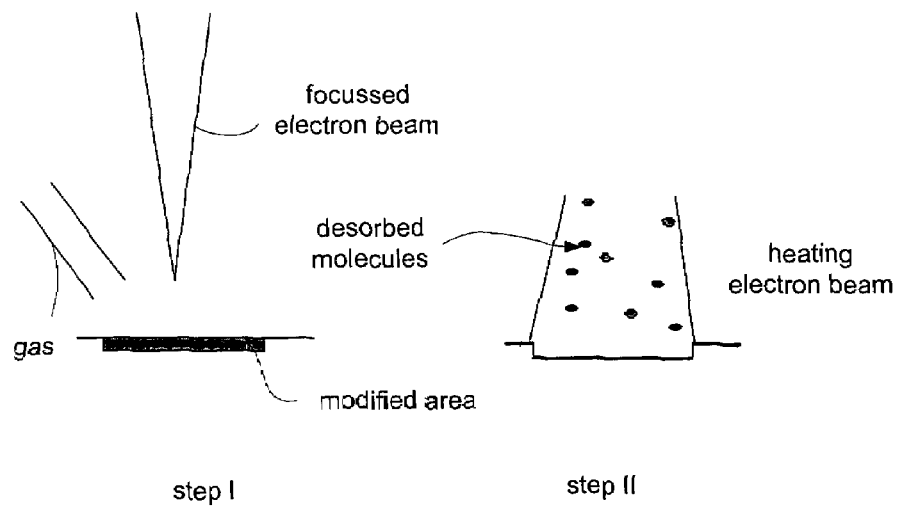
Figure 3:
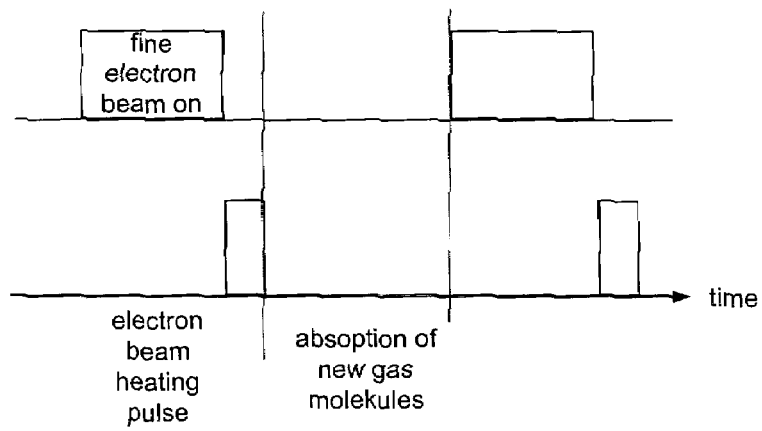

Further advantages and features of the invention will become apparent from the following description of an embodiment with reference to the attached drawing in which FIG. 1 is a schematic view of a mask repairs system according to the invention;

FIG. 2 is a schematic view of the main step of the procedure, namely reaction and removal steps, and FIG. 3 is a schematic view of subsequent beams of electrons and molecules according to the invention.

FIG. 1 shows a schematic set up of a mask repair system 10 having a known molecular beam delivery system, referred to in the following as gas supply system 12, a known electron beam system 14 and a computer control system 16 for timely triggered action and cooperation of these beams—beam of molecules and different beams of electrons—for the procedure according to the invention.

The electron beam system 14 is controlled by an electron beam control unit 18. Furthermore, the electron beam system 14 comprises a Faradays cage 20 for current measurement, electron beam deflector coils 22 with a beam blanker and a secondary electron detector 24 and corresponding control units 26—electron beam mode switching unit for focus mode, namely first beam of electrons, and heating mode, namely second beam of electrons—and 28.

The gas supply system 12 having a gas supply multi-jet control system 30 for controlling valves, pressures and temperatures of precursor gases. The gas supply multi-jet control system 30 is connected for controlling via CAN open bus 32 to the computer control system 16.

Several reservoirs—not shown for liquid or solid precursor—Peletier cooled—or heated—are connected via feedings to a nozzle manifold 34. The nozzle manifold 34 has end valves 36 at each nozzle.

An environmental chamber 38 is provided wherein the procedure according to the invention described below takes place. This can be achieved (resembled) by using the electron beam system 14, which enables to operate the sample chamber at high pressure using a variable pressure or environmental vacuum pressure control system, as supplied by instrument builders. Those systems also allow to rise the pressure in the sample chamber up to 15 torr without disabling the operation of the electron beam. The gas supply system 12 and the electron beam system 14 act in the environmental chamber 38. An interferometer controlled motorized stage 40 is provided to position a mask 42 to be repaired.

The computer control system 16 is provided to control the electron beam system 14. Therefore, the control unit 24 is connected with the Faradays cage 20 for current measurement.

For the time dependent control the control unit 8, 26 and 28 has a trigger.

Furthermore, a laser interferometer stage control unit 44 is connected with a stage 46 and the computer control system 16.

The procedure with the mask repair system 10 is now described:

The beam of electrons of a high resolution scanning beam system is used, which employs the brightest and in long terms stable electron source, the thermal field emission cathode. Well developed electron optical systems allow to focus the electron beam to 2 nm spot diameters having energies from 100 eV up to 40 keV or even 200 keV. The distribution of the electrons in the crossover of the beam is very sharp defined, due to the low lens aberrations and the low energy width of the electron source and the specialized beam path, which in some cases has no crossover, where the energy width of the beam broadens by Coulomb interaction of the electrons. In principle electron beam systems achieve a better performance, in terms of resolution and power density, than ion beam or photon beam systems by almost an order of magnitude each, see the following table:

TABLE 1

| Particles | Power density Brightness | Resolution | Energy range | Substrate damage |
|---|---|---|---|---|
| Ions | $10^4$ W/$cm^2$ $10^2$ A/$cm^2$ sr Volt | 100 nm | 10-30 keV | Mixing, metal doping |
| Electrons | $6\ 10^7$ W/$cm^2$ $10^3$ A/$cm^2$ sr Volt | 2 nm | 100 eV-200 ke 1 to 100 pA | none |
| Electron beam in a different setting | $6\ 10^7$ W/$cm^2$ −2 KW/$cm^2$ $10^3$ A/$cm^2$ sr Volt | 1 µm | 100 eV-100 keV 1 to 20 nA | Substrate surface heating to >300 K, no damage |

From the above table 1 one sees that beam of electrons in a different, e.g. high current setting can be delivered to a larger area with a very high power density and a short pulse duration to desorb surface layers.

Beams of electrons surpass the ion beams in power density by orders of magnitude, however, due to the low momentum transfer of electrons to the atoms of the workpiece, a much higher number of electrons is required than ions for the same action. Typically 50 to 250 times more electrons are required in comparison to ions. This results also from the much higher scattering cross sections of the slow ions, which are 48 times the square root of the mass number of the ion slower than the electrons, and therefore interact better with the atoms. In addition the Coulomb interaction for knock on processes is stronger by the factor of the nuclear charge of the ions. The ion impact however, generates a cascade of focussed knock on processes, which transfer the momentum of the ion into the depth of the sample, where it damages the material. The ion itself is implanted in a shallow region close to the surface of the sample and acts as an impurity and absorbs deep UV photons, especially at 157 nm.

A clean and nondestructive method is to use electrons and absorption of chemicals, to activate the absorbed chemicals to react with the substrate metal to form a solid, liquid or gaseous compound, and in the case of a liquid or solid reaction product to drive these molecules off the surface with a fine focussed high power electron pulse, which thermally heats the surface to a temperature above the sublimation or evaporation temperature of the chemical compound.

The procedure according to the invention employs the gas supply system 12 with high gas flux switching capability as described in DE 100 42 098 A1 and WO 02/19575 A1. These documents are part of the disclosure of this application in connection with the invention. This allows the deposition of single monolayers of precursors at the workpiece surface. A scanning electron beam system like a scanning electron microscope or a lithography system is required to pattern the surface of the workpiece with a well defined dwell time and current density.

The process of additive nanolithography is well described in the article: H. W. P. Koops, J. Kretz, M. Rodolph, M. Weber, G. Dahm, and K. Lee, "Characterization and application of materials grown by electron beam induced deposition", Jpn. J. Appl. Phys Vol. 33 (1994) 7099-7107. This article is part of the disclosure of this application in connection with the invention.

The beam of electrons might cause a potentially reactive molecule, for example halogens, to chemisorb onto the target material or it might change the chemical composition in some other way under electron beam induced activation, while no chemisorption or alterations in composition occur in areas that are not exposed to the electron beam.

The novel feature of the procedure is the timely coupling of the pulsed electron beam, which is switched on in a fine focused mode to stimulate the chemical reaction of the adsorbed chemicals with the substrate surface, without having the capability of heating the surface top monolayers, and then is changed in a different setting of the electron-beam column, meaning the selection of a different aperture, to allow a much higher current in the beam, which has the capability of heating the surface for a short time to high temperatures, and in turn after the chemical reaction with the adsorbed molecules and radicals has taken place drives off the non volatile reaction products. This is, due to the use of the same focusing optics, and is also possible at the bottom of deep holes, as they are produced in the application of circuit editing.

This fast changing of the beam current and focusing requires an electrically selectable aperture, which is not common in standard scanning electron microscopes and lithography systems, and a specialised fast beam position switch to select a different beam limiting aperture to change the current, and a fast setting of a focus coil in the last objective lens or its excitation to defocus the beam in an appropriate fashion. The defocus is required to arrange the power distribution in a way that the surrounding heating allows to heat up the center region to the required temperature. Since the semiconductor heat dissipation is very high, a reasonable amount of current and area has to be delivered and irradiated. This method can only be applied, if the electron beam limiting aperture is selected by an electric setting in the electron optical column using beam deflection fields, which can be switched at a MHz rate, as it is required to desorb the non volatile reaction products in a short time to obtain µm/sec etch rates.

The process can be built up in the following time sequence:

In a first step the electron pulse of high thermal power is switched on to clean the surface by thermally desorbing adosorbates. This time span lasts a few µseconds to a few milliseconds. Then the finely focused electron beam generates the adsorption sites with a dose of 1 mC/cm$^2$, a dose comparable to electron beam standard lithography. In this time the sample is at room temperature and the sticking coefficient of gas molecules is high. Then within a few milliseconds the precursor layer is chemisorbed to the activated surface, and the electron beam interaction with a well tailored energy density takes place to trigger the chemical etching reaction. This step requires a dose up to 10 C/cm$^2$. This dose is employed in a dwell time of 1 µmsec to 1 sec, depending on current, focus condition and electron energy. Alternatively, at least one non-reactive gas such as a fluorocarbon might be used, that decomposes under electron beam exposure and makes a chemical reaction to release active atoms and the decomposition products adsorb on the target material, only in areas that have been exposed. After this time the high current electron energy pulse or pulses hit the work piece and evaporate the reaction products of the chemical etching reaction. In any case the effect of the local electron beam exposure will be, that the exposed area is in some chemically activated state, that when selectively induced by the electron beam those areas will further react causing an etching process of the target material, see FIG. 2. In this process also catalysts can be applied, issued to the site with the multi-jet beam system and support the reaction by diffusing into the material during the heating time span.

After evaporation of the non-volatile reaction products, the process is repeated to work on the next monolayer of substrate material to obtain the etching into the depth at this site. This process can also be supported by catalytically enhanced reactions, e.g. etching chromium oxide with the help of a reduction reaction with aluminum.

In this "layer by layer etching" scheme the electron beam would be scanned or rastered across the area just long enough to cause a chemical modification of one or a few monolayers at the surface. A short high power electron beam pulse sent to the same site will then selectively desorb this modified layer for example thermally (this is know in the literature as electron beam induced thermal desorption) or by causing an electronic excitation of molecules, which are only present in the modified layer. The cycle of electron beam exposure and electron beam heating pulse is then repeated until the material is removed to the desired depth, see FIG. 3.

From the chemical analysis of the material of the desorbed monolayers the etch process can be monitored with a mass spectrometer in DC or in a lock in method, since the desorption and evaporation takes place in well defined time intervals.

The endpoint of the etching can also be determined chemically using electro-luminescence and optical light detection. This endpoint can also be detected interpreting the changing secondary electron or back scattered electron emission at the etched location. Table 2 shows the schematic sequence of the work steps

TABLE 2 schematic steps of the etching procedure

| Action | Beam | Time/Dose | Result |
|---|---|---|---|
| Electron beam in a different setting to heat the sample | Electrons with high current | msec, mJ/cm$^2$ | Desorption of adsorbates, Sample cleaning |
| Electron beam 100 eV to 200 keV | Areal scan to excite adsorption sites | msec, mC/cm$^2$ | Generation of adsorption sites for chemicals |
| Multi-Jet gas mixture on with 1 to 200 Monolayers/sec | Gas or precursor mixture for stoichiometric composition of etch gas | msec to sec 1 to 2 monolayers | Adsorption of reaction partners and instant reaction |
| Electron beam 100 eV to 200 keV | Activation of precursors and chemical etching reaction | msec to minutes, mC/cm$^2$ to 100 C/cm$^2$ | Chemical etching to solid, liquid or gaseous compound |
| Electron beam in high current setting to heat the location | Pulsed high power electron beam switched on after the focused beam triggered with the electron beam | µsec to minutes, J/cm$^2$ to KJ/cm$^2$ J = Joule | Evaporation of the chemical etch product By locally heating the material and the substrate |
| Repetition of the triggered action of the electron beam in the different settings | | | Multilayer by multilayer ablation of the surface. |

FIG. 2 gives the schematic of the experimental arrangement in step 1 for the adsorption of the precursors, and for the chemical reaction in the area, which was defined by the electron beam scanning exposure. A solid or slow evaporating material layer is generated.

FIG. 3 shows the time sequence for the etching and the materials evaporation action.

List of Reference Signs 10 mask repair system
12 molecular beam system/gas supply system
14 electron beam system
16 computer control system
18 electron beam control unit
20 Farradays cage
22 electron beam deflector coils
24 secondary electron detector
26 control unit/electron beam switching unit
28 control unit
30 gas supply multi-jet control system
32 CAN open bus
34 manifold nozzle
36 end valve
38 environmental chamber
40 interferometer controlled motorized stage
42 mask to be repaired
44 laser interferometer stage control
46 stage

The invention claimed is:

1. Procedure for etching a sample, said sample comprising a material and having a surface, by focussed electron beam induced chemical reaction at said surface and in a portion of said material, comprising the steps of:
   a. providing an electron beam column capable of generating a focussed electron beam,
   b. feeding, in a vacuum atmosphere, molecules of a reaction gas to said surface of said sample,
   c. irradiating said surface, said portion of material of said sample to be etched and said molecules of said reaction gas in said vacuum atmosphere with at least one first beam of electrons; said surface, said portion of said material to be etched and said molecules of said reaction gas undergo a chemical reaction forming a reaction product which is not gaseous and not volatile, said reaction product having a vaporisation temperature and a sublimation temperature, and
   d. irradiating said reaction product with a second electron beam which heats said reaction product and said material locally above at least one of said vaporisation temperature and said sublimation temperature to remove said reaction product from said surface.

2. Procedure according to claim 1 wherein said second beam of electrons is generated in a pulsed and/or focussed way.

3. Procedure according to claim 1 wherein said surface of said sample to be etched is initially cleaned by thermal desorption with electron beam heating.

4. Procedure according to claim 1 wherein said surface of said sample has carbon contamination thereon and further comprising the step of reacting excited halogen atoms released by a beam of molecules comprising water, hydrogen peroxide, chlorine and other halogen compounds with said carbon contamination to effect cleaning of said surface of said sample, said step of reacting is performed before said step of providing an electron beam column capable of generating a focussed electron beam.

5. Procedure according to claim 1 wherein said molecules of said reaction gas include selected chemical compounds in a stoichiometric composition issued from a gas feeding system to said surface of said sample during said step of irradiating said surface, said portion of material of said sample to be etched, and said molecules of said reaction gas in said vacuum atmosphere with said at least one first beam of electrons.

6. Procedure according to claim 1 wherein said molecules of said reaction gas are issued with a multi-jet supply to enhance the reaction.

7. Procedure according to claim 1 wherein said surface of said sample has silicon oxide contamination thereon and further comprising the step of reacting excited halogen atoms released by a beam of molecules comprising chlorine or other halogen compounds with said silicon oxide contamination under irradiation with a third electron beam to effect cleaning of said surface of said sample, said third electron beam generated with a different aperture setting over said first and second beams of electrons, said step of reacting is performed before said step of providing an electron beam column capable of generating a focussed electron beam.

8. Procedure according to claim 7 comprising a fourth beam of electrons and wherein a second reaction product is formed by said reaction between said silicon oxide contamination and said beam of molecules which is not gaseous and which is not volatile is evaporated by heating with said fourth beam of electrons to heat said surface of said sample to a temperature above the vaporization temperature of said second reaction product, said fourth electron beam generated in a different aperture setting over said first and second beams of electrons.

9. Procedure for etching a sample, said sample comprising a material and having a surface, by focussed electron beam induced chemical reaction at said surface and in a portion of said material, comprising the steps of:
   a. providing an electron beam column capable of generating a focussed electron beam,
   b. feeding, in a vacuum atmosphere, molecules of a reaction gas to said surface of said sample,
   c. irradiating said surface, said portion of material of said sample to be etched and said molecules of said reaction gas in said vacuum atmosphere with at least one first beam of electrons; said surface, said portion of said material to be etched and said molecules of said reaction gas undergo a chemical reaction forming a reaction product which is not gaseous and not volatile, said reaction product having a vaporisation temperature and a sublimation temperature, and
   d. irradiating said reaction product with a second electron beam which heats said reaction product and said material locally above at least one of said vaporisation temperature and said sublimation temperature to remove said reaction product from said surface; wherein said first electron beam and said second electron beam are generated by different settings of the same electron beam column.

10. Procedure according to claim 9 wherein said second beam of electrons is generated in a pulsed and/or focussed way.

11. Procedure according to claim 9 wherein said surface of said sample to be etched is initially cleaned by thermal desorption with electron beam heating.

12. Procedure of claim 9, wherein said electron beam column comprises several beam limiting apertures and wherein said different settings of said electron beam column are created by passing said electron beam column through different ones of said several beam limiting apertures.

13. Procedure of claim 12, wherein a selection between individual ones of said several beam limiting apertures is performed electrically by deflection fields.

14. Procedure for etching a sample, said sample comprising a material and having a surface, by focussed electron beam induced chemical reaction at said surface and in a portion of said material, comprising the steps of:
   a. providing an electron beam column capable of generating a focussed electron beam,
   b. feeding, in a vacuum atmosphere, molecules of a reaction gas to said surface of said sample,
   c. irradiating said surface, said portion of material of said sample to be etched and said molecules of said reaction gas in said vacuum atmosphere with at least one first beam of electrons; said surface, said portion of said material to be etched and said molecules of said reaction gas undergo a chemical reaction forming a reaction product which is not gaseous and not volatile, said reaction product having a vaporisation temperature and a sublimation temperature,
   d. irradiating said reaction product with a second electron beam which heats said reaction product and said material locally above at least one of said vaporisation temperature and said sublimation temperature to remove said reaction product from said surface; wherein said second beam of electrons has a higher intensity than said first beam of electrons.

15. Procedure according to claim 14 wherein said second beam of electrons is generated in a pulsed and/or focussed way.

16. Procedure according to claim 14 wherein said surface of said sample to be etched is initially cleaned by thermal desorption with electron beam heating.

17. Procedure according to claim 14, wherein said second electron beam provides an electron current in the range between 1 and 20 nA.

18. Procedure of claim 17, wherein said electron beam column comprises several beam limiting apertures and wherein different settings of said electron beam column are created by passing said electron beam column through different ones of said several beam limiting apertures.

19. Procedure of claim 18, wherein a selection between individual ones of said several beam limiting apertures is performed electrically by deflection fields.

20. Procedure of claim 14, wherein said first electron beam is irradiated to said surface of said sample in a focussed manner and wherein said second beam of electrons is irradiated to said surface of said sample in a defocused manner compared to said focussing of said first electron beam.

21. Procedure of claim 20, wherein said electron beam column comprises several beam limiting apertures and wherein in different settings of said electron beam column are created by passing electron beam column through different ones of said several beam limiting apertures.

22. Procedure of claim 21, wherein a selection between individual ones of said several apertures is performed electrically by deflection fields.

23. Procedure according to claim 22, wherein said second electron beam provides an electron current in the range between 1 and 20 nA.

24. Procedure for etching a sample, said sample comprising a material and having a surface, by focussed electron beam induced chemical reaction at said surface and in a portion of said material, comprising the steps of:
   a. providing an electron beam column capable of generating a plurality of focussed electron beams using different apertures;
   b. heating said sample with a first electron beam to clean said surface of said sample and desorb adsorbates;
   c. generating adsorption sites for molecules of a reaction gas with a second electron beam scan;
   d. feeding, in a vacuum atmosphere, molecules of a reaction gas to said surface of said sample,
   e. irradiating said surface, said portion of material of said sample to be etched and said molecules of said reaction gas in said vacuum atmosphere with at least one third beam of electrons; said surface, said portion of said material to be etched and said molecules of said reaction gas undergo a chemical reaction forming a reaction product which is not gaseous and not volatile, said reaction product having a vaporisation temperature and a sublimation temperature; and
   f. irradiating said reaction product with a fourth electron beam which is a pulsed power beam which heats said reaction product and said material locally above at least one of said vaporisation temperature and said sublimation temperature to remove said reaction products from said surface; wherein said first, said second and said third electron beams are generated by different settings of the same electron beam column.

* * * * *